United States Patent [19]
Snider

[11] Patent Number: 5,315,178
[45] Date of Patent: May 24, 1994

[54] IC WHICH CAN BE USED AS A PROGRAMMABLE LOGIC CELL ARRAY OR AS A REGISTER FILE

[75] Inventor: Gregory S. Snider, Mountain View, Calif.

[73] Assignee: Hewlett-Packard Company, Palo Alto, Calif.

[21] Appl. No.: 113,578

[22] Filed: Aug. 27, 1993

[51] Int. Cl.⁵ ................. H03K 17/177; H03K 17/687; G11C 11/407

[52] U.S. Cl. ................... 307/465; 307/243; 307/244; 365/189.02; 365/230.02; 365/230.05

[58] Field of Search ....................... 340/825.83, 825.91; 307/243, 244, 465; 365/189.02, 189.03, 189.04, 230.02, 230.04, 230.05

[56] References Cited

U.S. PATENT DOCUMENTS

| | | | |
|---|---|---|---|
| 4,933,909 | 6/1990 | Cushing et al. | 315/230.02 |
| 4,963,770 | 10/1990 | Keida | 307/243 |
| 5,111,431 | 5/1992 | Gade | 365/189.02 |
| 5,115,411 | 5/1992 | Kass et al. | 365/189.02 |
| 5,245,227 | 9/1993 | Furtak et al. | 307/243 |

OTHER PUBLICATIONS

Gray et al., "The Case for Custom Computation", Second International Specialist Seminar on the Design and Application of Parallel Digital Processors, Lisbon, Portugal, Apr. 1991, pp. 60–64.
Freeman, "User-Programmable Gate Arrays", IEEE Spectrum, vol. 25, Dec. 1988, pp. 32–35.
Brandenburg et al., "Poor Man's Gate Arrays–Logic Cell Arrays", IEEE Transactions on Nuclear Science, vol. 35, pp. 213–216, Feb. 1988.
Kean et al., "Implementation of Configurable Hardware Using Wafer Scale Integration", IEEE Computer Society Press, Jan. 1990, pp. 68–73.
"ACT Family Field Programmable Gate Array Datebook", Actel Corporation, Apr. 1990, pp. 1-11-1-20 and 1-41-1-49.
Bertin et al., "Introduction to Programmable Active Memories", Digital Equipment Corporation (Paris Research Laboratory), Jun. 1989, pp. 1–9.
Gray et al., "Configurable Hardware: A New Paradigm for Computation", Proceedings of the 1989 Decennial Caltech Conference on VLSI, Pasadena, Calif., Mar. 1989.
Kean et al., "Configurable Hardware: Two Case Studies of Micro-Grain Computation", Proceedings of the International Conference on Systolic Arrays, Killarney, May 1989.
Vitanen et al., "Image Pattern Recognition Using Configurable Logic Cell Arrays", CG International '89, 7th Annual Conference of the Computer Graphics Society (CGS), Leeds, Jun. 1989.
Kean et al, "A Novel Implemantation Style for Teaching VLSI", Proceedings of the 1989 VLSI Education Conference and Exposition, Santa Clara, Jul. 1989.

*Primary Examiner*—Edward P. Westin
*Assistant Examiner*—Benjamin D. Driscoll

[57] ABSTRACT

A programmable logic cell array (PLCA) architecture that provides efficient support for demultiplexers or multi-ported register files without sacrificing PLCA functionality or flexibility is disclosed. The architecture of conventional PLCs is modified so that demultiplexers can be implemented in a single PLC operated backwards. Furthermore, read ports and write ports for multi-ported register files can be implemented on a PLCA with individual PLCs serving as either a read port or a write port for a bit slice. In particular, a PLC memory of a PLC is modified such that it can function to pass signals to its inputs from a PLC multiplexer (selector) when the PLC multiplexer (built from a tree of pass transistors) is operated backwards so as to function as a demultiplexer (decoder). Moreover, a multi-ported register file be efficiently implemented by placing a register file on the PLCA and either modifying the PLC memory so that it operates in various modes (normal, forwards and backwards) or providing OR circuits for the write ports. In the normal mode the PLCs operate as conventional PLCs, in the forward mode the PLCs operate as read ports, and in the backwards mode the PLCs operate as write ports. The architectural modifications require very little additional circuitry beyond what is normally required by PLCAs. Moreover, the invention achieves a substantial compression in the number of PLCs needed to implement demultiplexers or multi-ported register files.

15 Claims, 14 Drawing Sheets

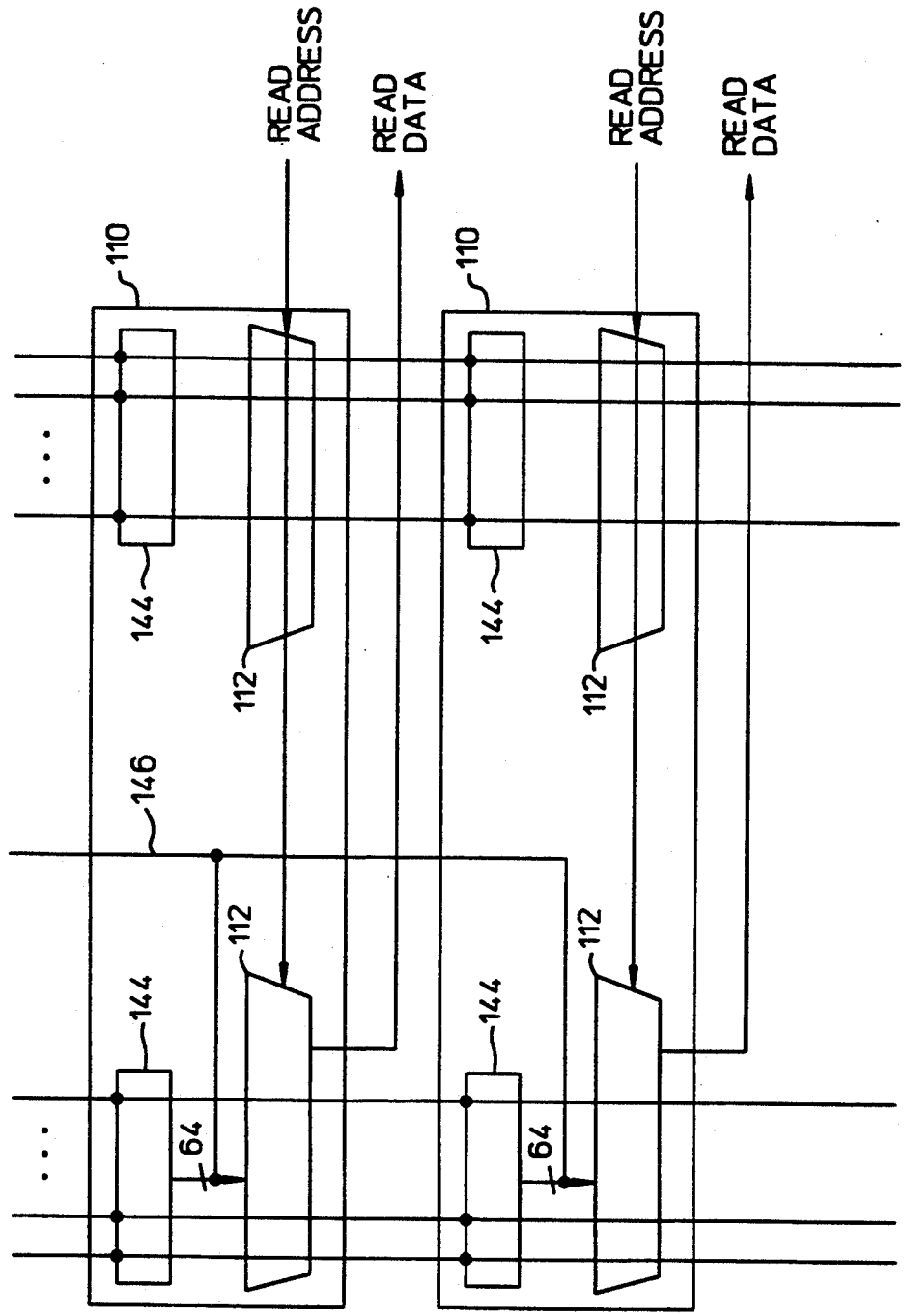

IC WHICH CAN BE USED AS A PROGRAMMABLE LOGIC CELL ARRAY OR AS A REGISTER FILE

BACKGROUND OF THE INVENTION

1. Field of the Invention

The present invention relates to a programmable logic cell array and, more particularly, to a programmable logic cell array architecture that efficiently supports demultiplexers and multiported register files.

2. Description of the Related Art

Programmable Logic Cell Arrays (PLCAs) are integrated circuits that contain configurable digital logic functions and routing resources. See e.g., Brandenburg et al., *Poor Man's Gate Arrays: Logic Cell Arrays*, IEEE Transactions on Nuclear Science, Vol. 35, No. 1, February 1988, pp. 213-216; Freeman, *User-programmable Gate Arrays*, IEEE Spectrum, December 1988, pp. 32-35. Through suitable programming, a PLCA can emulate a variety of different logic circuits. The ability to program and re-program PLCAs has proven to provide a great deal of flexibility to circuit designers.

The flexibility offered by PLCAs makes it possible to quickly prototype new logic designs without the expense of building the design from discrete components or fabricating the design in a custom integrated circuit. The trade-off, of course, is that since PLCAs are intended to support a wide variety of logic designs, the architecture of PLCAs must include routing and logic functionality that is unlikely to be used in all applications. Therefore, the efficiency or effective utilization of PLCA resources for a given application tends to be low compared to that which can be achieved in a custom integrated circuit implementation. This loss of efficiency is mitigated by the flexibility of the device, but there are some digital circuits which, when mapped onto a conventional PLCA, exhibit such extremely poor efficiency that implementing them in a PLCA (or a system of PLCAs) is impractical.

Because of their flexibility, PLCAs are important components in the construction of very high speed logic simulators or, more generally, configurable hardware systems (also called "virtual hardware"). See e.g., Kean et al., *Implementation of Configurable Hardware using Wafer Scale Integration*, 1990 International Conference on Wafer Scale Integration, pp. 68-73; Kean et al., *Configurable Hardware: A new Paradigm for Computation*, 1989 Decennial Caltech Conference on VLSI. In such applications, hundreds or thousands of PLCAs are connected electrically to form a prototype testbed for designing and experimenting with new digital system designs. A new design is "mapped" onto the simulator by programming the component PLCAs so that the simulator as a whole functionally emulates the behavior of the system being designed. This makes it possible to design, debug and test large, complex logic systems (such as computer processors, graphics engines, digital signal processing systems, etc.) much faster than is possible using conventional tools, such as software simulation and hardware prototyping.

An important component of many new high speed digital circuit designs (e.g., computer processor designs) is a multiported register file (an array of registers that can be read and written on many different ports simultaneously). Hence, in order for a logic simulator constructed from PLCAs to support the development of such digital circuit designs, it is desirable to map such register files onto PLCAs. Unfortunately, a serious problem exists which makes it impossible to map demultiplexers or register files into known PLCA architectures with sufficient efficiency to be practical.

When multi-ported register files are implemented with pure Boolean logic, they require a large number of gates. For example, an 80-bit wide file of 96 registers with four write ports and eight read ports requires more than 250,000 2-input gates or logic functions. It is estimated that such a multiported register file would require over 400 conventional PLCAs to be represented, if it can be done at all.

One might hope that expressing such a circuit in terms of 6-input, 2-output logic cells might lead to a significant reduction in the number of logic functions needed, since this has been observed to occur for many other circuits. For example, Xilinx Corporation of San Jose, Calif. has PLCA software that can take a circuit consisting of 2-input, 1-output gates and transform it to a logically equivalent circuit of 5-input, 2-output gates (logic functions), often achieving a reduction in the number of needed gates by a factor of 10 or more. However, this does not happen for demultiplexers (decoders) or multi-ported register files. For example, the register file mentioned above compresses to approximately 90,000 6-input, 2-output gates (logic functions), which is a very low amount of compression compared to many other circuits. Using PLCAs containing 256 6-input, 2-output logic cells (which is a fairly typical number of existing PLCAs) to implement the register file, would require a minimum of 350 of them, assuming infinite routing resources and no I/O pin limitations. Many more PLCAs that this are likely to be required in practice.

Another approach might be to handle a multi-ported register file as a special case by building it out of discrete components and interfacing it to the simulator. However, this approach is not practical for a number of reasons. One reason is that the special case approach requires a large number of discrete, off the shelf components (e.g., more than 100). Another reason is that the special case approach requires a large number of signals to be interfaced to the simulator (e.g., more than 1000). Yet another reason why the special case approach is impractical is because it is inflexible with respect to the register file parameters (e.g., bit width, number of registers, number of ports).

Thus, there is a need for a PLCA architecture that can efficiently support demultiplexers and multiported register files without sacrificing PLCA functionality or flexibility.

SUMMARY OF THE INVENTION

Broadly speaking, the invention is an improved programmable logic cell array (PLCA) architecture that provides efficient support for demultiplexers and multiported register files without sacrificing PLCA functionality or flexibility.

Basically, the invention alters the architecture of conventional PLCs so that demultiplexers and multiported register files can be efficiently implemented in PLCAs. Conventionally, each PLC of a PLCA is implemented with a PLC multiplexer (selector) and a PLC memory. According to the invention, the PLC memory is modified such that it can function to pass signals from the PLC multiplexer (selector) to the inputs of the PLC when the PLC multiplexer (built from a tree of pass transistors) is operated backwards so as to function as a demultiplexer (decoder). Therefore, PLCs according to the invention implement demultiplexers when the PLCs are operated backwards. Moreover, a multi-ported register file can be efficiently implemented by placing a register file on the PLCA and modifying the PLC memory so that it operates in various modes (normal, forwards and backwards). In the normal mode the PLCs operate as conventional PLCs, in the forward mode the PLCs operate as read ports, and in the backwards mode the PLCs operate as write ports.

In a first embodiment of the invention, a PLCA includes at least PLCs having more inputs than outputs, with each of the PLCs being capable of performing a logic function; and configurable routing resources to connect inputs and outputs of the PLCs. Each of the PLCs is implemented with at least a PLC memory and a PLC multiplexer, whereby, in a normal mode, the PLC memory stores data and the PLC multiplexer selects and outputs the data and, in a backwards mode, the PLC multiplexer operates as a demultiplexer and the PLC memory passes data output by the demultiplexer to the inputs of the PLC which serve as outputs in the backwards mode.

In a second embodiment of the invention, a PLCA includes at least one register file for storing data; PLCs having inputs and outputs, a plurality of the PLCs being operatively connected to the register file, and each of the PLCs being operable in a forward mode, a backwards mode and a normal mode; and configurable routing resources to connect inputs and outputs of the PLCs. Write ports for the register file are formed by the PLCs operated in the backwards mode, and read ports for the register file are formed by the PLCs operated in the forward mode. Each PLC is implemented with at least a PLC memory and a PLC multiplexer. In the backwards mode, the PLC multiplexer operates as a demultiplexer and the PLC memory passes data output by the demultiplexer to the inputs of the PLC which serve as outputs in the backwards mode. Further, in the backwards mode, the data which is output from the inputs of the PLC are coupled to the register file to perform write operations. In the forward mode, the PLC memory passes data input to the PLC from the register file to the PLC multiplexer which selects and outputs the data.

There are several advantages associated with the invention. First, the modifications to conventional PLCA are minimal. In particular, the modifications require very little additional circuitry beyond what is normally required by PLCAs. Second, the invention achieves a substantial compression in the number of PLCs needed to implement demultiplexers or multiported register files. For example, the number of PLCs needed to implement a 80×96 register file with 4 write ports and 8 read ports would be reduced from about 90,000 to less than 3,000.

BRIEF DESCRIPTION OF THE DRAWINGS

The present invention will be readily understood by the following detailed description in conjunction with the accompanying drawings, wherein like reference numerals designate like structural elements, and in which:

FIGS. 14A and 14B are block diagrams of a second detailed embodiment of a multi-ported register file in accordance with the invention.

DETAILED DESCRIPTION OF THE INVENTION

The invention is a PLCA architecture supporting non-reductive functions, such as demultiplexers and multiported register files. The invention requires only minimal changes and additions to the circuitry conventionally provided in existing PLCA architectures that implement reductive functions. An important feature of the invention is that it takes advantage of existing structures in PLCAs by enabling them to operate backwards.

In order to fully appreciate the invention, it is useful to first describe the structure of demultiplexers and multiported register files and then describe why conventional PLCA architectures are unable to effectively model demultiplexers and multiported register files. Such a discussion follows.

Figure 1:
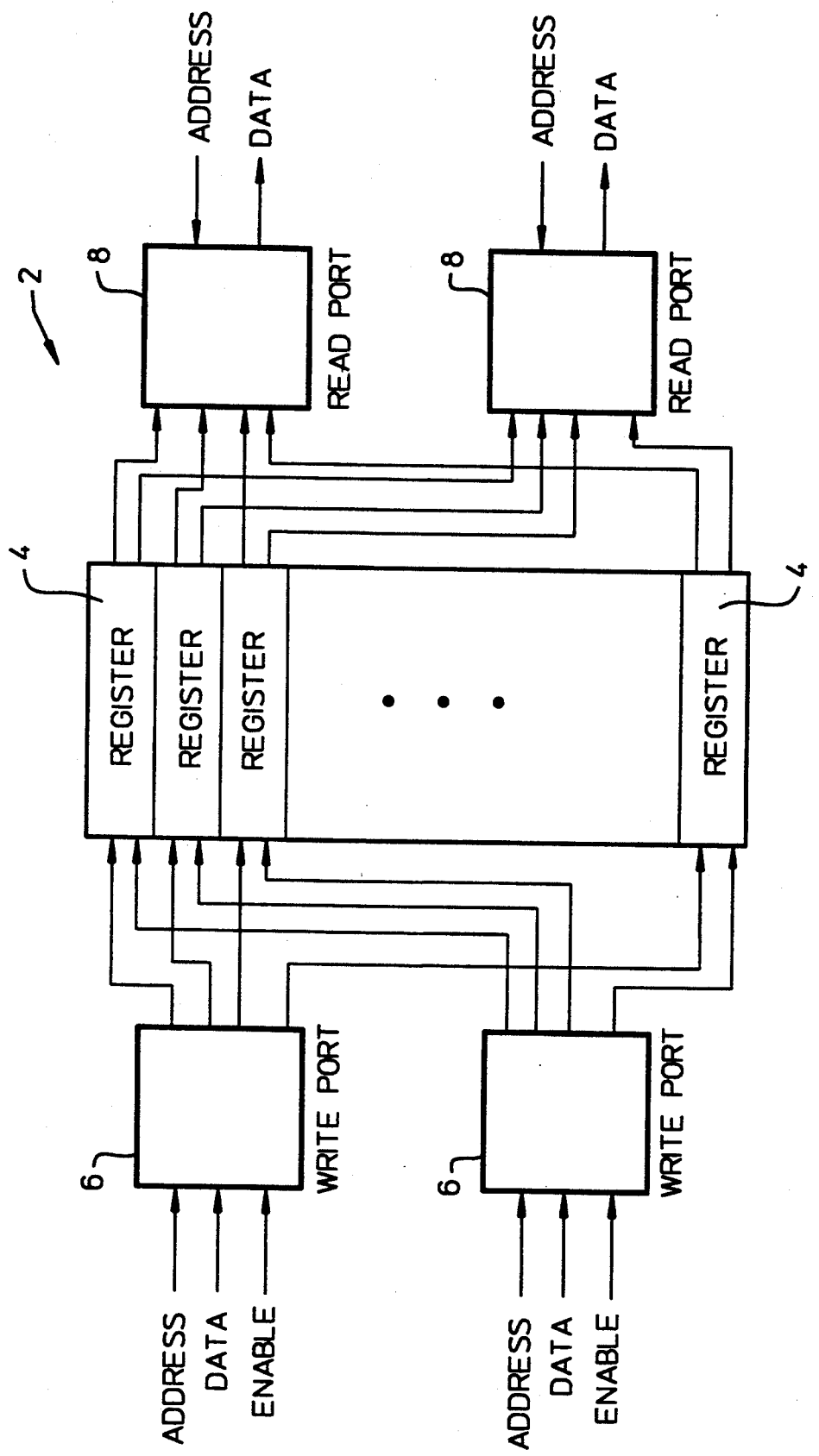
FIG. 1 is a block diagram of a multiported register file represented at a high level as an array of registers that can be simultaneously written by several write ports and read by several read ports.

FIG. 1 is a block diagram of a multiported register file 2 represented at a high level as an array of registers 4 that can be simultaneously written by several write ports 6 and read by several read ports 8. Each write port 6 takes as inputs the address of the register 4 to be written, the data to be written to that register 4, and a write enable line that is asserted to actually perform the write operation. Each read port 8 takes an address of the register 4 to be read as an input, and supplies the contents of that register 4 as an output. To simplify the following discussion, it is assumed that the register file 2 consists of N registers, with each register being one bit wide. However, it should be clear that the discussion extends to registers that are wider.

Figure 2:
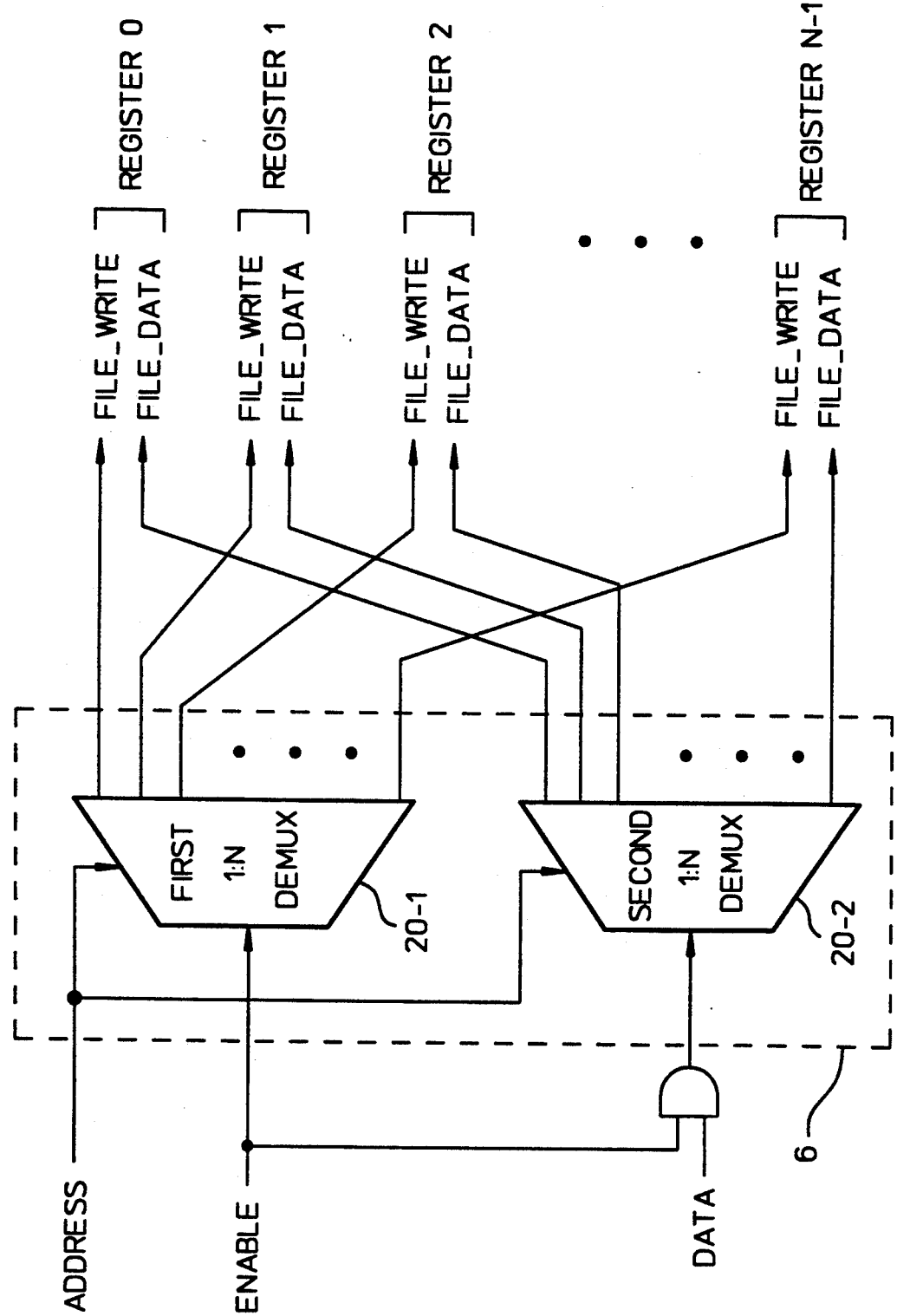
FIG. 2 is a block diagram of an implementation of a write port for a multiported register file such as shown in FIG. 1.

FIG. 2 is a block diagram of an implementation of the write port 6 shown in FIG. 1. Namely, each write port 6 consists of first and second 1:N demultiplexers 20 which deliver a pair of signals to each of the N single bit registers 4 in the register file 2. The first demultiplexer 20-1 decodes the address and write enable signal to supply a FILE_WRITE signal to, at most, one of the N registers 4. The second demultiplexer 20-2 decodes the address and routes input data as a FILE_DATA signal to the same register 4 as the first multiplexer 20-1. These signals tell each register 4 whether or not data should be written and, if so, what data to write. Each write port 6 is capable of writing to only a single register at a time.

Figure 3:
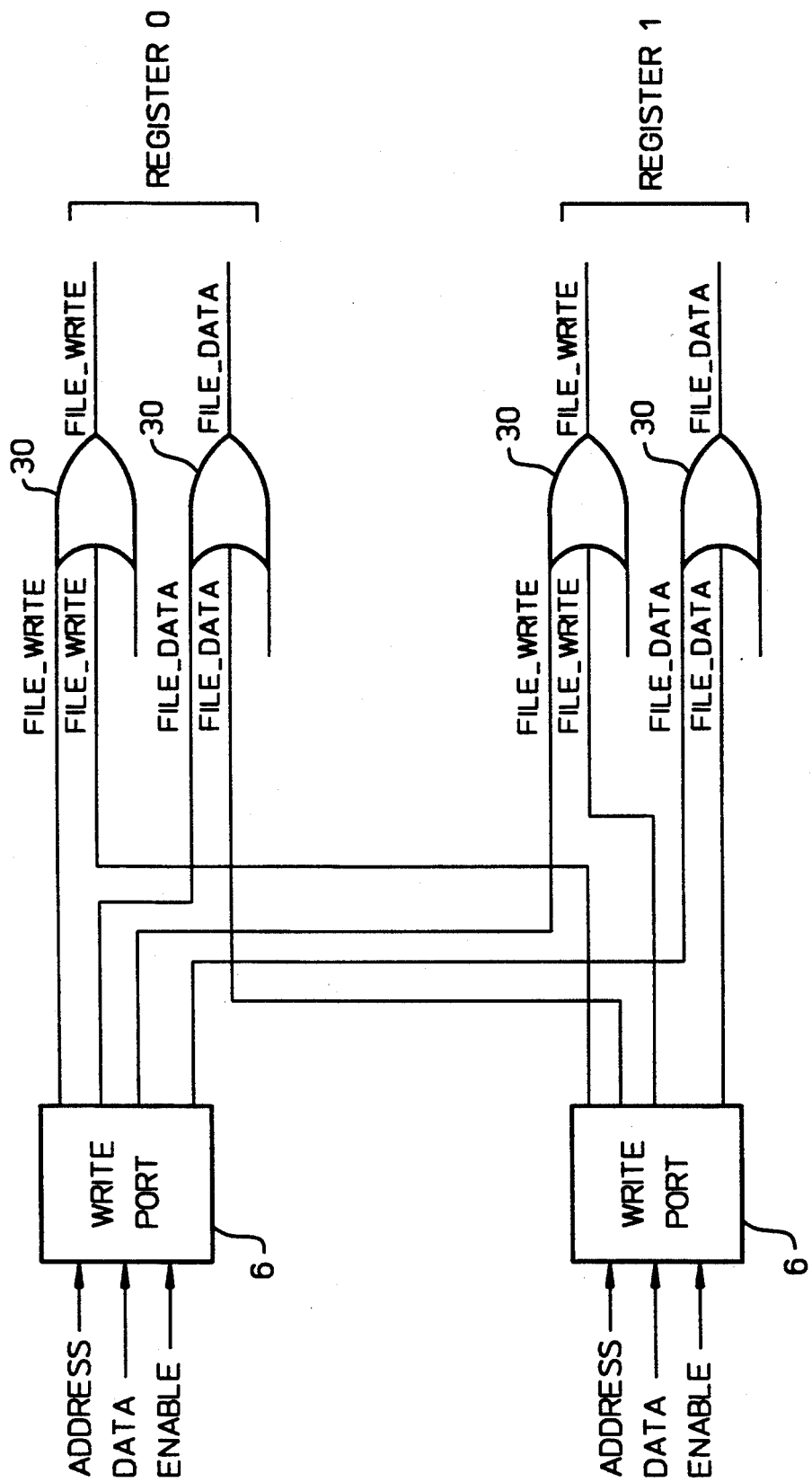
FIG. 3 is a block diagram of an implementation of multiple write ports for a multiported register file such as shown in FIG. 1.

When multiple write ports 6 interface to the register file 2, the pair of signals (FILE_WRITE, FILE_DATA) from each write port 6 must be combined as shown in FIG. 3 before being delivered to a register 4, since each register 4 can process only a single pair of signals (FILE_WRITE, FILE_DATA). For a given register 4, the FILE_WRITE signals from each of the write ports 6 are logically ORed together to form a combined FILE_WRITE input signal. The logical ORing may be performed by OR gates 30 as shown in FIG. 3. Similarly, the FILE_DATA signals from each of the write ports 6 are ORed together to form a combined FILE_DATA input signal. Note that two ports attempting to write the same register at the same time is an undefined operation.

Figure 4:
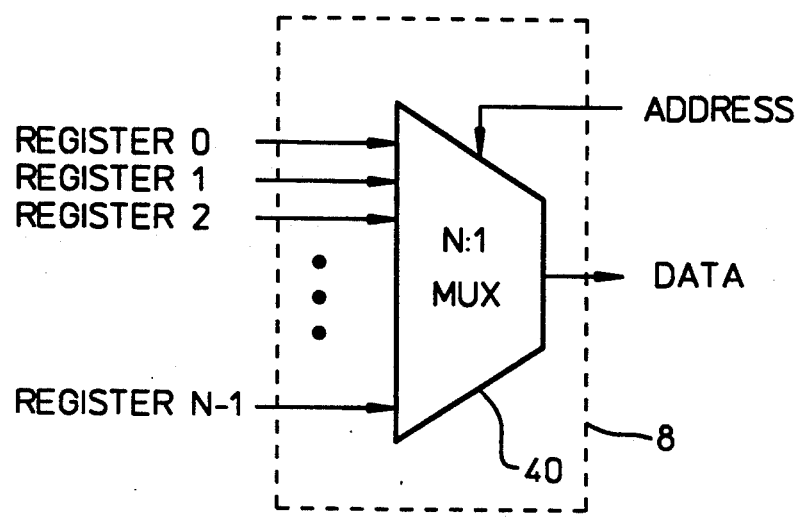
FIG. 4 is a block diagram of an implementation of a read port for a multiported register file such as shown in FIG. 1.

FIG. 4 is a block diagram of an implementation of the read port 8 for the multiported register file 2 shown in FIG. 1. The read port 8 consists of a multiplexer 40 that selects the contents of the register 4 referenced by the input address and delivers it to its output. Multiple read ports 8 simply share the outputs of the registers 4 and do not require any combining operations as do write ports 6.

Figure 5:
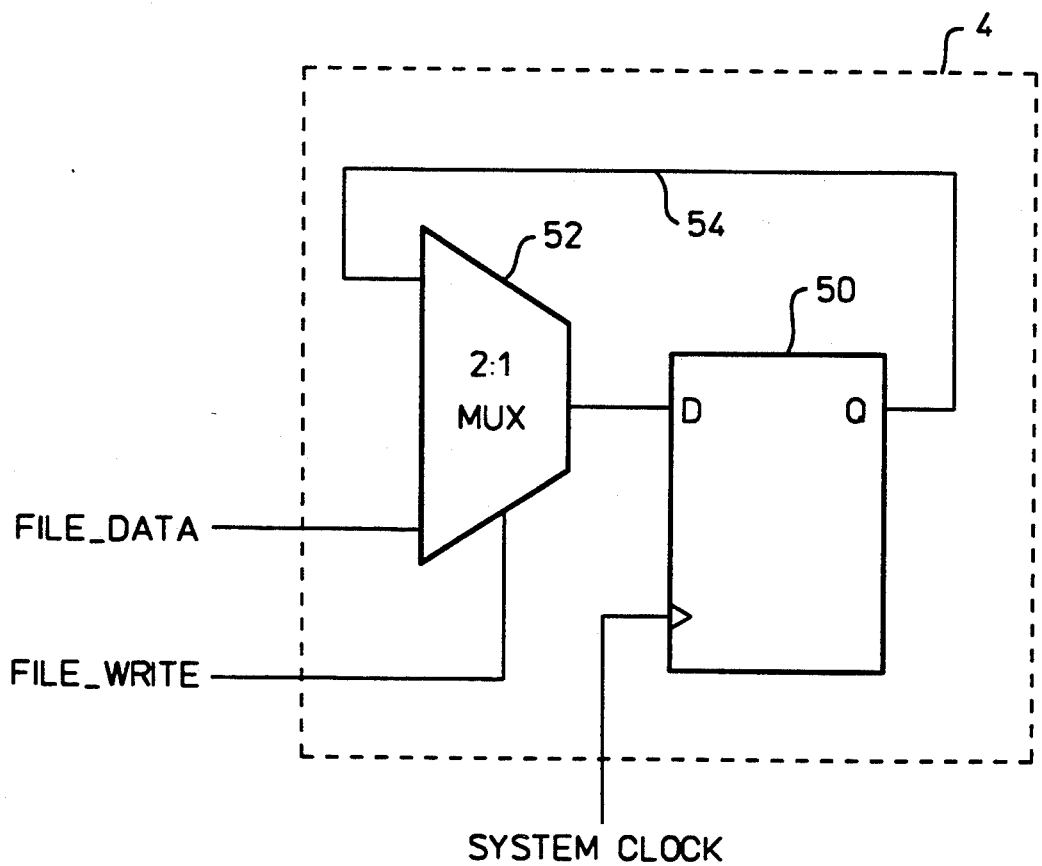
FIG. 5 is a block diagram of an implementation of a memory cell of the register file shown in FIG. 1.

Each register 4 (more precisely each bit of each register) of the register file 2 might be implemented as a D-type flip-flop 50 and 2:1 multiplexer 52 as shown in FIG. 5. In FIG. 5, the FILE_WRITE signal selects one of two signals (FILE_DATA or the current output 54 of the flip-flop) as input to the flip-flop 50. When FILE_WRITE is asserted, the FILE_DATA signal is delivered to the D input of the flip-flop 50, otherwise, the current output 54 of the flip-flop 50 is recirculated back to its input so that the state of the flip-flop 50 is effectively held without change when clocked by a system clock.

Figure 6:
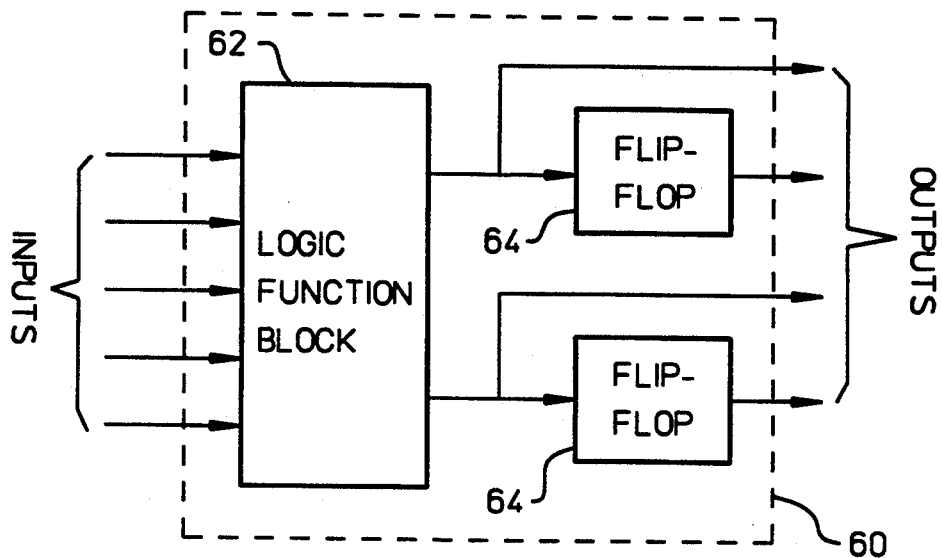
FIG. 6 is a block diagram of a programmable logic cell of a PLCA.

Most conventional PLCAs comprise two main components: programmable logic cells which implement some combinatorial logic function, and configurable routing resources which can be used to connect the inputs and outputs of the logic cells to each other and to external I/O pins. FIG. 6 is a block diagram of a programmable logic cell 60. The programmable logic cell 60 consists of a logic function block 62 which takes several inputs and produces one or more outputs, often followed by optional flip-flops 64. Typically, as shown in FIG. 6, when the programmable logic cell 60 includes flip-flops 64, the output of the logic cell 60 is able to bypass the output of the flip-flops 64 if desired. Commercially available PLCAs typically have from three to nine inputs and only one or two outputs. It is important to note that the functions supported existing PLCs are all reductive. Namely, existing PLCs take a number of inputs and combine them to produce a smaller number of outputs.

Figure 7:
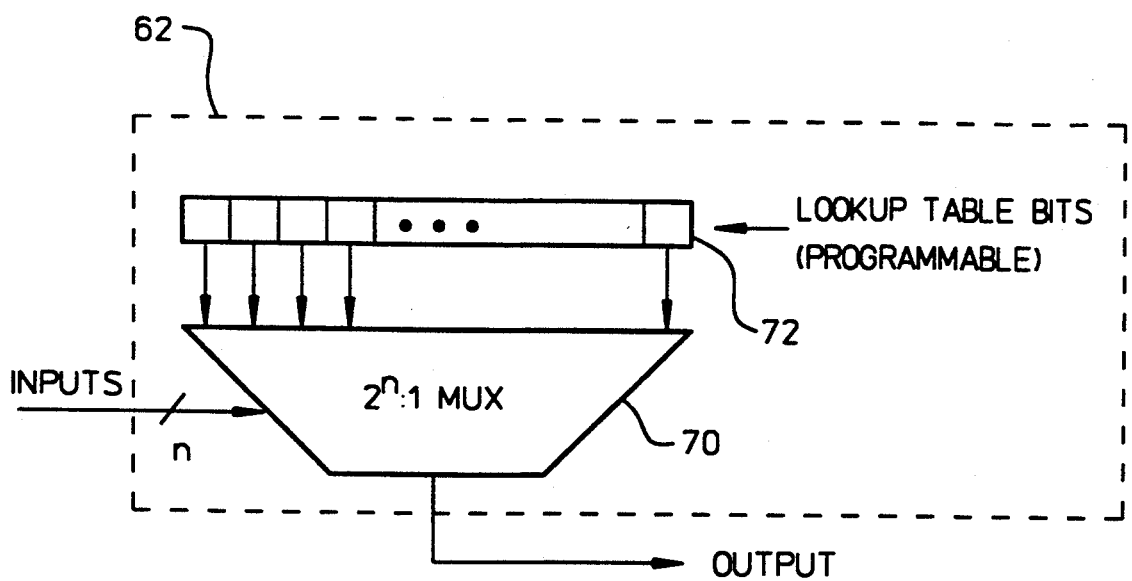
FIG. 7 is a block diagram of a logic function block of a PLCA implemented as a programmable look-up table.

The logic function block 62 is most often, though not always, implemented as a programmable look-up table. FIG. 7 is a block diagram of a logic function block 62 implemented as a programmable look-up table. In FIG. 7, the programmable look-up table consists of a multiplexer 70 and a small programmable memory 72, both of which are implemented in the logic function block 62. Input signals are used by the multiplexer 70 to address one of the bits of the memory 72 so that the desired function can be output. This scheme allows any arbitrary function of the inputs to be implemented.

The above description of the structure of demultiplexers and multiported register files helps explain why conventional PLCA architecture is unable to effectively model demultiplexers and multiported register files. It is believed that the demultiplexers are the source of the problem. As discussed above, the write ports of multi-ported register files require use of demultiplexers.

Demultiplexers are non-reductive logic elements; that is, they take a small number of inputs and transform them to a large number of outputs. In contrast, as discussed above, the logic cells within PLCAs are reductive. Although reductive logic is a reasonable architecture design decision, reductive logic makes it difficult to implement circuits containing non-reductive logic, since implementing such logic with reductive logic cells is extremely inefficient.

One solution might be to include a few non-reductive logic cells in a PLCA to handle situations like this, but drawbacks render this solution impractical. The drawbacks of providing a few non-reductive logic cells in a PLCA are: (1) it must be done at the expense of circuits not needing such functions; (2) so many non-reductive logic cells would be needed (at least for the case of multi-ported register files) there would be little room left on the PLCA for the reductive functions; and (3) the amount of PLCA routing resources would have to be greatly increased to handle the larger number of signals, thus reducing the number of logic cells which can be accommodated on a single chip.

The invention provides a novel solution to this problem so that PLCAs efficiently support non-reductive circuits (such as demultiplexers and multi-ported register files) without significantly penalizing circuits that do not require such support.

Embodiments of the invention are discussed below with reference to FIGS. 8-14. However, those skilled in the art will readily appreciate that the detailed description given herein with respect to these figures is for explanatory purposes as the invention extends beyond these limited embodiments.

In the following discussion it will be assumed that the PLCA comprises programmable logic cells (PLCs) having 6 inputs and 2 outputs, since it is believed this represents the best use of current hardware and software technology, although the invention is applicable to configurable logic blocks with a different number of inputs and outputs.

Figure 8:
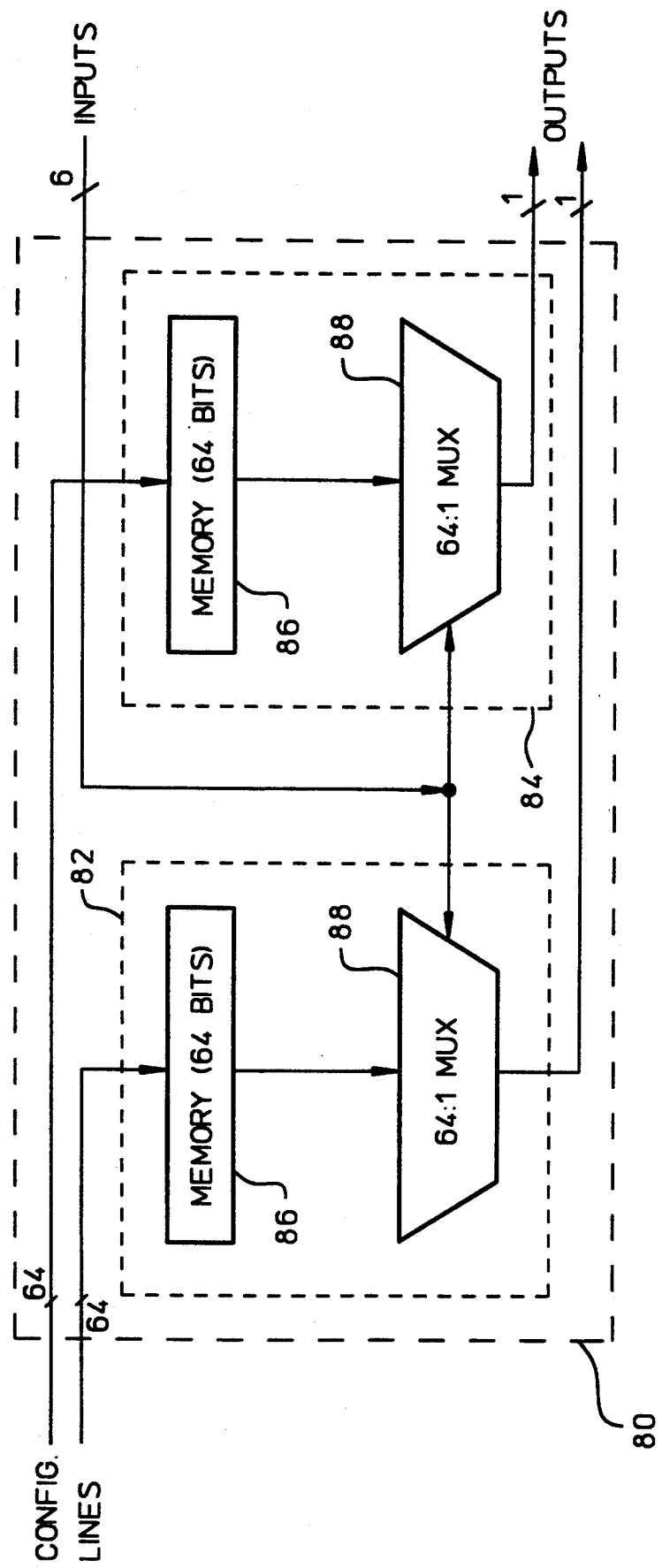
FIG. 8 is a block diagram of a 6-input, 2-output programmable logic cell.

A 6-input, 2-output PLC can be implemented as shown in FIG. 8 (if one bypasses the optional flip-flops on the outputs of the PLCs shown in FIG. 6). Internally, the 6-input, 2-output logic function block 80 is implemented as two 6-input, 2-output functions 82, 84, with the same set of 6 inputs used for each function 82, 84. The truth table for each 6-input output function 82, 84 is stored in a 64-bit memory ($2^6 = 64$) 86. During configuration, each 64 bit memory 86 is written using the configuration lines shown; during normal operation, the configuration lines are electrically disconnected from the memories 86 so that the memories 86 will hold the bits that have been programmed into them. The six input signals (selected and driven by the routing resources of the PLCA) are used to address two 64:1 multiplexers 88, each of which selects one of the 64 bits in the memory 86 associated therewith and drives it back out to the routing network. Note that any function of 6 inputs and 2 outputs can be implemented by appropriate configuration of the 64-bit memories.

Figure 9:
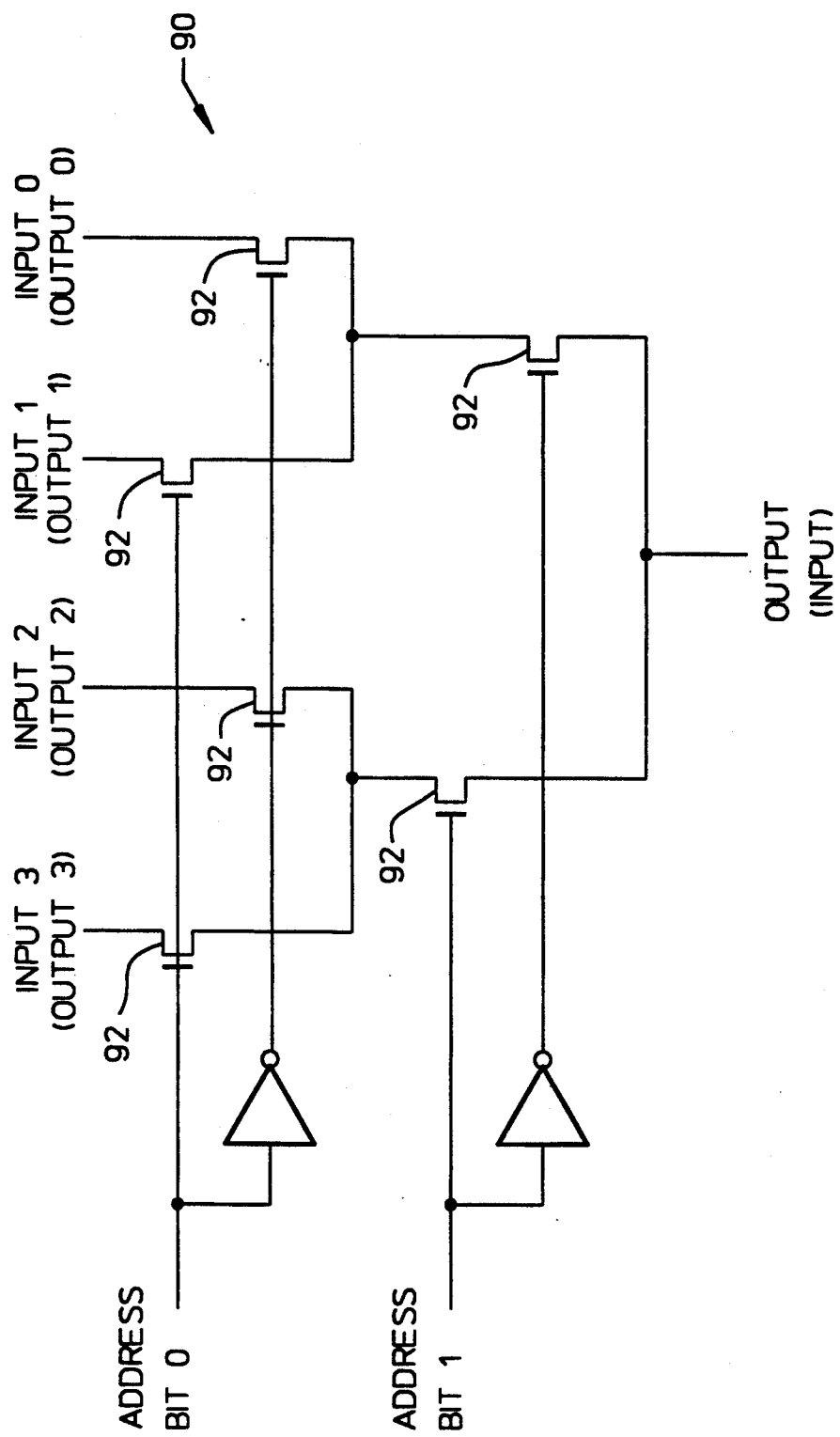
FIG. 9 is a schematic diagram of a 4:1 multiplexer implemented using pass transistors.

PLCAs are typically manufactured using technologies which are bi-directional, such as MOSFETs. In such bi-directional technologies (e.g., CMOS, NMOS, PMOS), the 64:1 multiplexers 88 are more efficiently implemented using a tree of pass transistors rather than Boolean gates (e.g., bipolar transistors). FIG. 9 is a schematic diagram of a 4:1 multiplexer 90 implemented using a tree of pass transistors 92, with the same principles applying for the construction of larger multiplexers. The important thing to note is that by running this circuit "backwards" (i.e., using the single output as an input and the multiple inputs as outputs), the circuit functions as a demultiplexer.

The invention makes use of this backwards operation to facilitate the modeling of demultiplexers and multi-ported register files in PLCAs. Specifically, by operating the multiplexers 88 in the PLC 80 backwards, the multiplexers 88 function as demultiplexers. Implementing the multi-ported register file 2 is more complicated. A read port can be implemented with a N:1 multiplexer (see FIG. 4). Specifically, by disabling the PLC memory 86, the PLC multiplexer 88 can be used for this function. A write port can be implemented using two 1:N demultiplexers (see FIG. 2). By disabling the PLC memories 86 and running the two PLC multiplexers 88 backwards, the two PLC multiplexers become demultiplexers.

Thus, the non-reductive logic needed to implement demultiplexers and multi-ported register files is available when the PLCs are operated backwards. The invention provides a means by which this reductive logic can be accessed. In the case of multi-ported register files, the only other functionality needed is the ORing of the FILE_WRITE and FILE_DATA signals needed to support multiple write ports, as shown in FIG. 3. As will be shown below, this functionality can be accomplished using wired-AND logic on the configuration lines or OR gates.

PLCs are generally arranged in some sort of two dimensional array in PLCAs. Each column can be considered to be 16 independent PLCs, or it can be configured as a single unit to become a 1 bit wide multi-ported register file of 64 registers and 16 ports. It is preferable to consider the PLCs as being logically grouped into "columns," with each column containing, for example, 16 PLCs. The use of columns in this manner reduces wiring distances.

Figure 10:
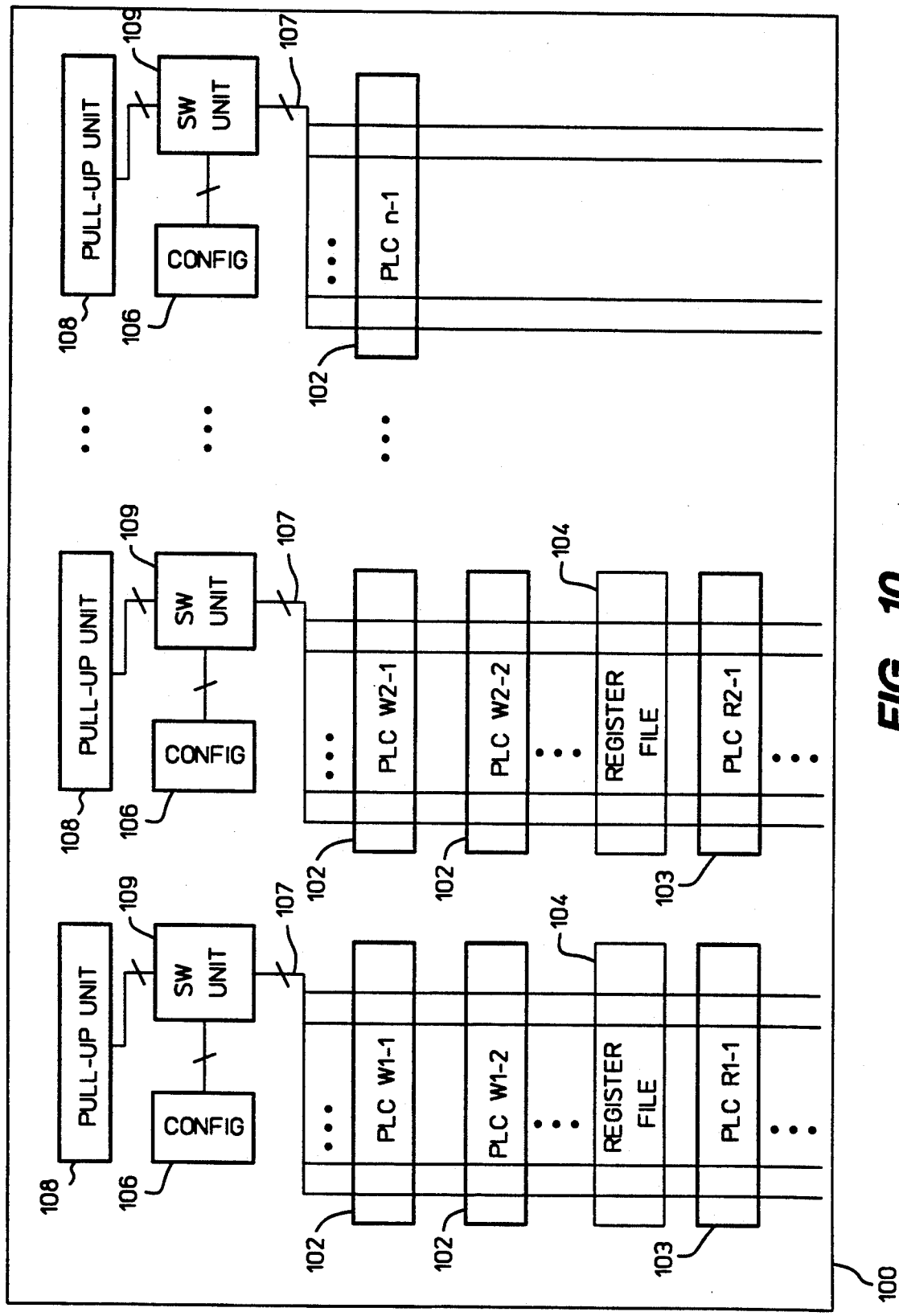
FIG. 10 is a block diagram of a basic embodiment of the PLCA architecture for a multi-ported register file in accordance with the invention.

FIG. 10 is block diagram of a basic embodiment of a multi-ported register file in accordance with the invention. As shown in FIG. 10, a PLCA 100 includes a plurality of PLCs 102, 103, register files 104, configuration circuits 106, configuration lines 107, pull-up circuits 108, and switching circuits 109. Although the PLCs 102, 103 are typically arranged in columns as shown in FIG. 10 any topology may be used. The register files 104 may be provided anywhere on the PLCA 100, but are preferably within the middle of each column to separate read ports from write ports. For example, as shown in FIG. 10, the write ports 102 are above the corresponding register file 104, and the read ports 103 are below the corresponding register file 104.

The configuration circuit 106 exists on conventional PLCAs and need not be discussed further. However, in accordance with the basic embodiment of the invention, the configuration lines 107 for each column are coupled to each of the PLCs 102, 103 and register file 104 within the respective column. Note that the register file 104 has a pass-through state so that the configuration lines 107 can be coupled to the PLCs 103 through the register file 104 during programming of the PLC memories.

The switch unit 109 is controlled by a mode control signal. When the PLCA 100 is operated in its normal mode, the PLC memories within the PLCs 102, 103 are programmed by signals generated by the configuration circuit 106 and then supplied to the configuration lines 107 via the switch unit 109. On the other hand, when the PLCA is operated in its register file mode, the inputs of the PLC memories of the PLCs 102 (write ports only) are coupled to the pull-up unit 108 via the switch unit 109 and to the register file 104. However, when the PLCA 100 is operated in its register file mode, the inputs of the PLC memories of the PLCs 103 (read ports only) are coupled to the outputs of the register file 104 via the configuration lines 107. In addition, when the PLCA is operated in the register file mode, signals on the configuration lines 107 do not simply pass through the register file 104 as they do in the pass-through mode.

The details of the construction of the PLCs 102, 103, the register file 104, the pull-up unit 108 and the switch unit 109 are discussed below with reference to other figures. Even so, when the PLCA is operated in the register file mode, the PLCs are either operated in a backwards mode so as to form write ports or in a forward mode so as to form read ports. Further, as for implementing a demultiplexer, each PLC operated in the backwards mode implements a demultiplexer.

Figure 11A:
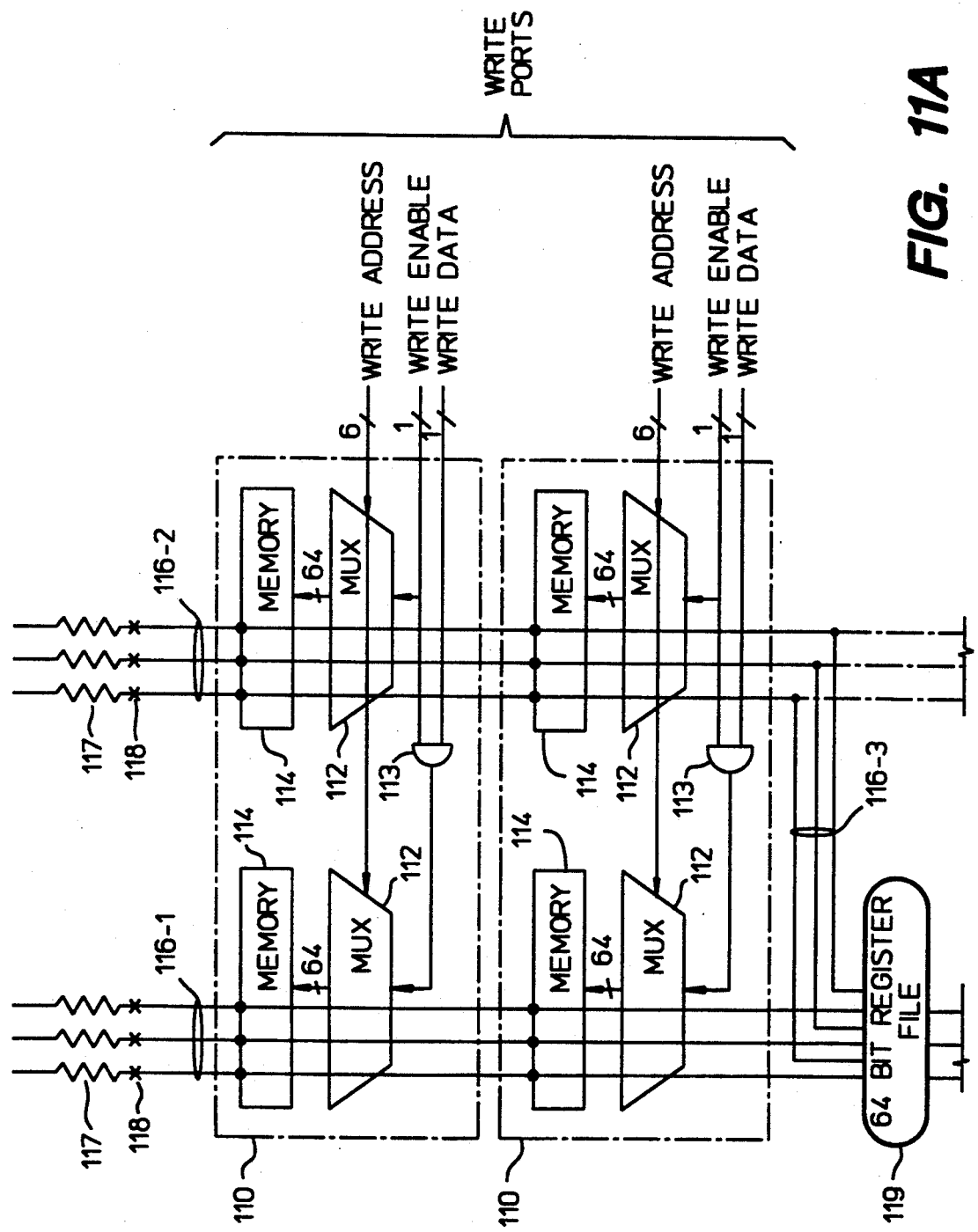
FIGS. 11A and 11B are block diagrams of a first detailed embodiment of a multi-ported register file in accordance with the invention.
Figure 11B:
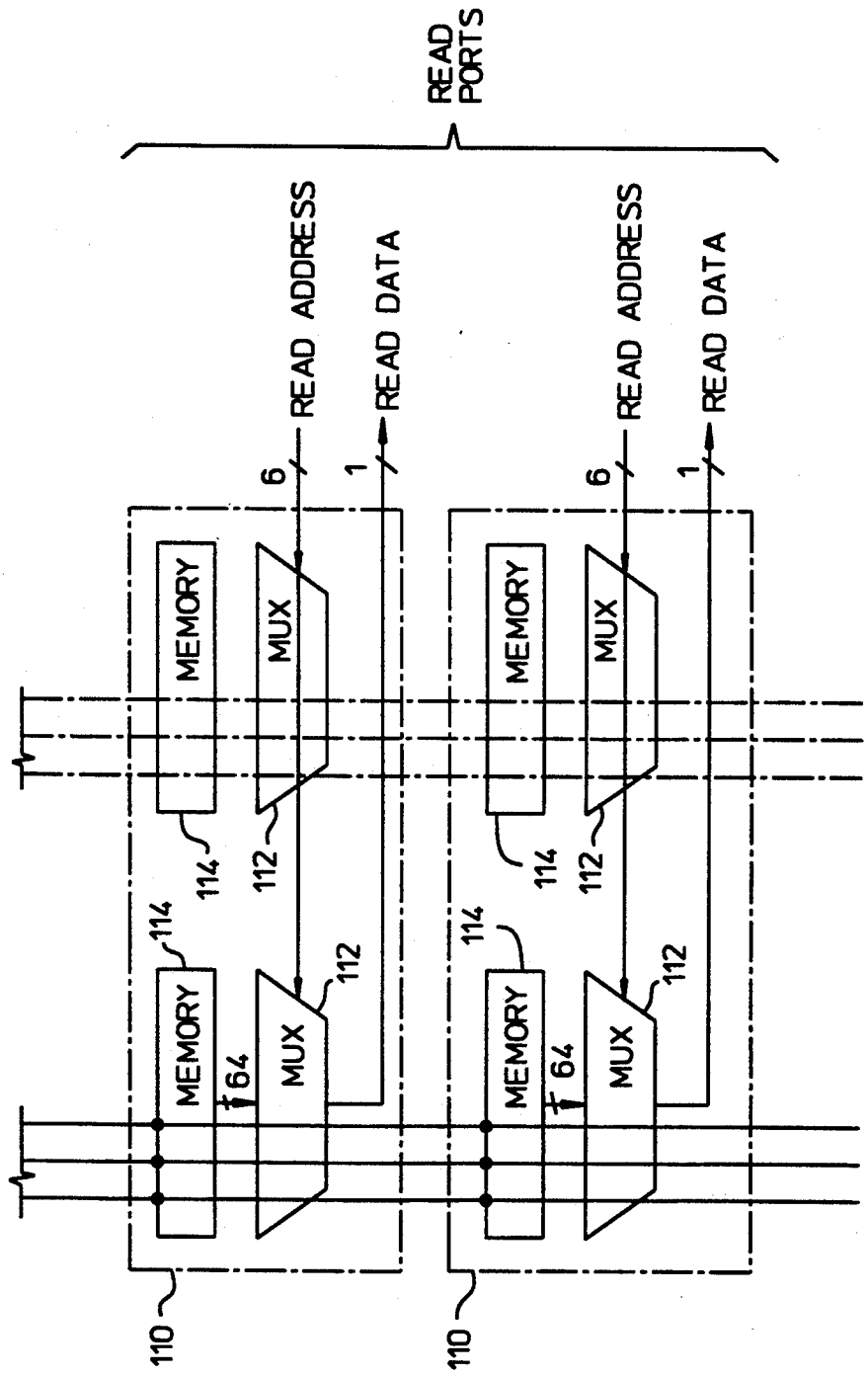

FIGS. 11A and 11B illustrates a block diagram of a first detailed embodiment of a multi-ported register file which is implemented efficiently using PLCs. A column of PLCs 110 within a PLCA is shown in FIGS. 11A and 11B. However, for simplicity sake, only four of the PLCs of the column are shown. Each PLC 110 consists of two multiplexers 112 built out of bi-directional gates (i.e., switch trees), tri-state AND gates 113, two sets of 64 bit PLC memories 114, and two sets of configuration lines 116-1, 116-2 (64 bits per set) to program the bits of the PLC memories 114. Each set of configuration lines 116-1 and 116-2 forms a bus. During configuration, configuration data is sent in parallel over the bus to all PLCs 110 in a column at the same time, but only one of the PLCs 110 is enabled to accept the data. Thus, each PLC 110 time-shares the configuration lines 116-1, 116-2 with the other PLCs in its column, thereby saving chip real estate.

In order to be able to use the PLCAs as multi-ported register files, two additional components need to be added; namely, pull-up resistors 117 connected through an electrically controllable switch 118 (represented by the "x" in FIG. 11A) to the top of each configuration line which connects to Vcc, and a 64-bit register file 119. Preferably, the 64-bit register file 119 approximately bisects at least one of the 64 bit configuration buses 116. In any event, as shown in FIG. 11A, the register file 119 is operatively connected to the buses 116-1 and 116-2.

The improved PLCA architecture according to the invention is able to function in two different modes. In a first (normal) mode, the PLCs of a column are configured and operate as individual PLCs. In a second (register file) mode, the PLCs of a column are configured and operate as a multiported register file bit slice. Each of these modes is discussed in more detail below.

In the first mode, the PLCs 110 in a column operate like individual PLCs in a conventional PLCA. During configuration of the column, the pull-up resistors 117 at top of the configuration lines 116-1, 116-2 are disconnected from the configuration lines by the controllable switch 118, and the configuration lines 116-1, 116-2 are driven by conventional configuration circuitry (FIG. 10).

In the first mode, the 64-bit register file 119 is put into a pass-through state. In the pass-through state all 64 signals which the register file 119 receives from the left half-column of the configuration lines 116-1 above it are driven down to the left half-column of configuration lines 116-1 below it, and the 64 signals received by the register file 119 from the right half-column are simply ignored. Each PLC memory 114 uses the configuration lines 116-1, 116-2 as an input to program its bits, but, as discussed earlier, only one PLC 110 is programmed at a time. Preferably, when the register file 119 is in pass-through state, it not only relays the signals down the column, but also regenerates them.

During operation, the register file 119 is not programmed; hence, the memory bits are effectively disconnected from the configuration buses 116. After configuration, the 64 bit register file 119 may be left in the pass-through state if desired, but it no longer can effect the functioning of the PLCA.

When in the first mode, the PLC memories 114 operate in a conventional manner. Namely, each bit is stored in back-to-back inverters. Each inverter pair is connected through a pass transistor to a configuration line. When the program signal is asserted during configuration, the pass transistors are turned to the "on" state, and data from the configuration buses 116 overdrives the bit previously stored, thus programming the bits.

In the second mode, the PLCs 110 in a column operate as ports for a multi-ported register file. In particular, each PLC 110 above the 64 bit register file 119 is used as a write port, and each PLC 110 below the register file 119 is used as a read port. Further, the 64 bit register file 119 is used as a 1 bit wide file of 64 registers. The pull-up registors 117 are connected to the configuration lines 116 which are used as "wired ANDs". Together these components form a 64×1 bit slice, which can be combined with other bit slices to form registers files of arbitrary size. Note the pull-up resisters 117 and the controllable switches 118 are one implementation of the pull-up unit 108 and the switch unit 109 illustrated in FIG. 10.

The tri-state AND gates 113 are only enabled when the PLC 110 is to function as a write port for a register file. FIG. 13A illustrates the AND gates 113 in the PLCs 110 operating as write ports. The AND gates 113 prevent data from being written when not authorized by the write enable signal. On the other hand, the AND gates 113 are bypassed or not present when the PLCs 110 do not function as write ports. For example, in FIG. 11B the PLCs 110 operate as read ports; therefore, the AND gates 113 are not illustrated because they are either nonexistent or inactive.

When a column is to be configured as ports for a multi-ported register file, the PLC memories 114 do not have to be programmed because they are not used in the operation of the multi-ported register file. Hence, in the second mode, the PLC memory 114 is operated in a pass-through state because a memory function is neither needed nor desired. By pass-through state it is meant both the case where the output signal is the input signal and the case where the output signal is the input signal inverted.

Figure 12A:
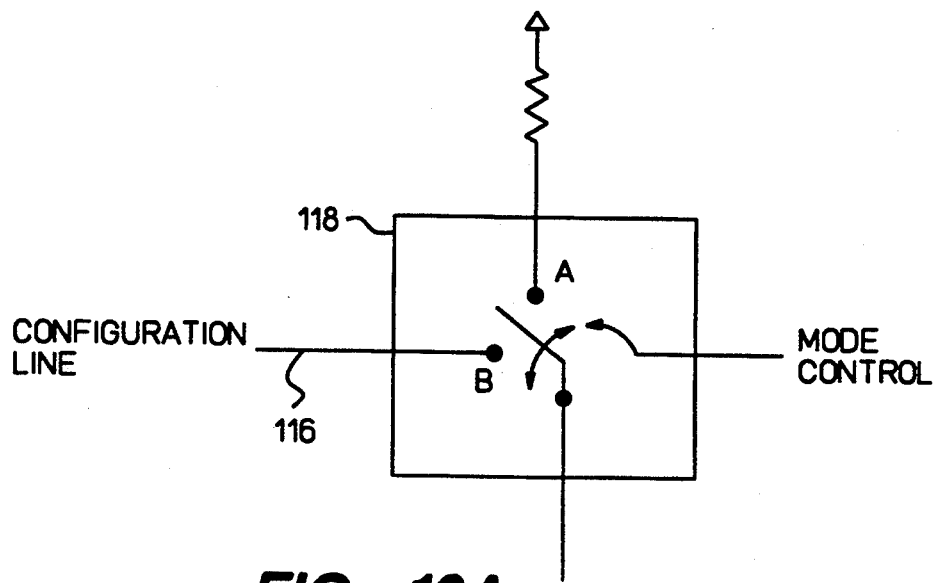
FIG. 12A is a schematic diagram of an implementation of the controllable switch shown in FIGS. 11A and 11B.
Figure 12B:
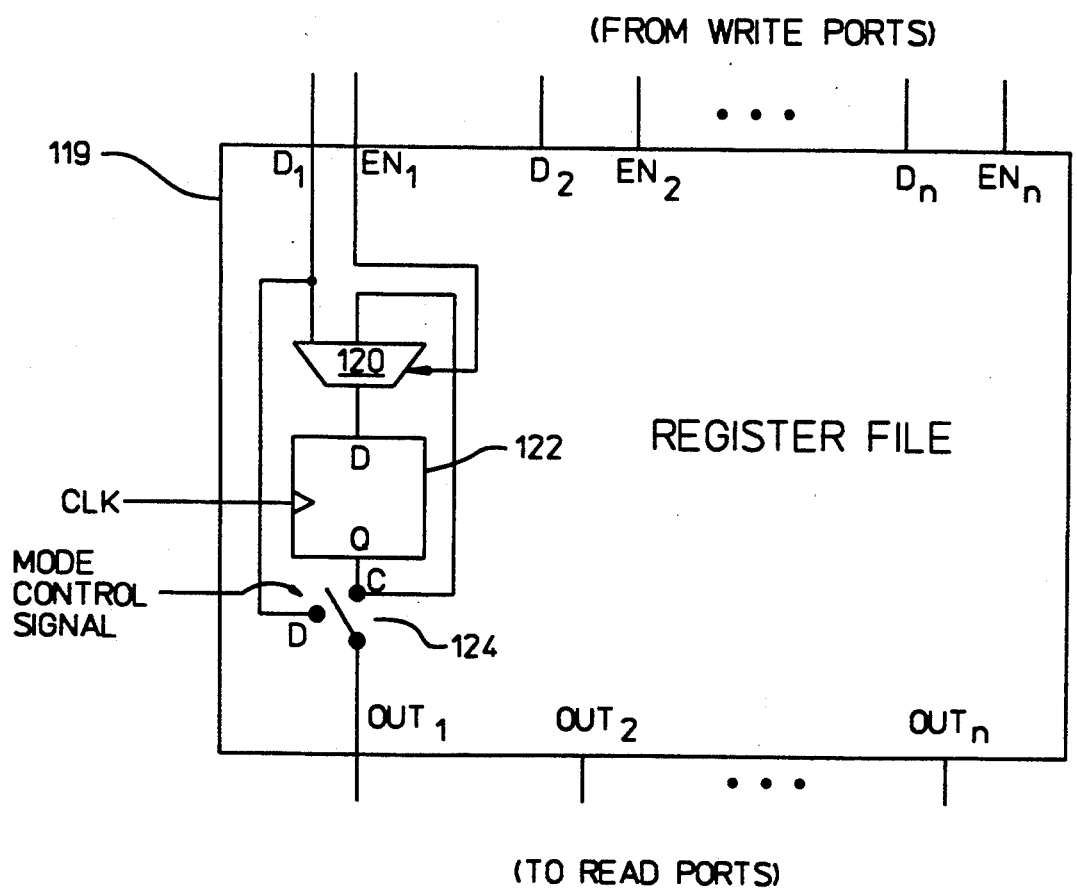
FIG. 12B is a block diagram of an implementation of the register file shown in FIG. 11.

FIG. 12A is a schematic diagram of an implementation of the controllable switch 118 shown in FIG. 11A. The switch 118 is controlled by a mode control signal so as to select a configuration line 116 (terminal B), a pull-up resistor (terminal A), or nothing. FIG. 12B is a block diagram of an implementation of the register file 119 shown in FIG. 11A. The register file 119 receives data signals D and enable signals EN from the configuration buses 116. Each memory cell within the register file 119 may be implemented with a selector 120 and a D-type flip-flop similar to that shown in FIG. 5. The difference is that each memory cell has a pass-through state for the normal mode. FIG. 12B illustrates using a switch 124 to switch between terminals C and D in accordance with a mode control signal. In the first mode, the switch 124 connects the output of the register file 119 to terminal D to bypass the memory cell. In the second mode, the switch 124 connects the output of the register file 119 to terminal C.

Although the preferable implementation uses the existing configuration buses 116 to not only configure the PLC memories 114 but also to supply signals from the PLCs 110 acting as write ports to the register file 119, additional wires could be used to supply signals from the write ports to the register file. However, such additional wires complicates the design and takes up die space.

Figure 13:
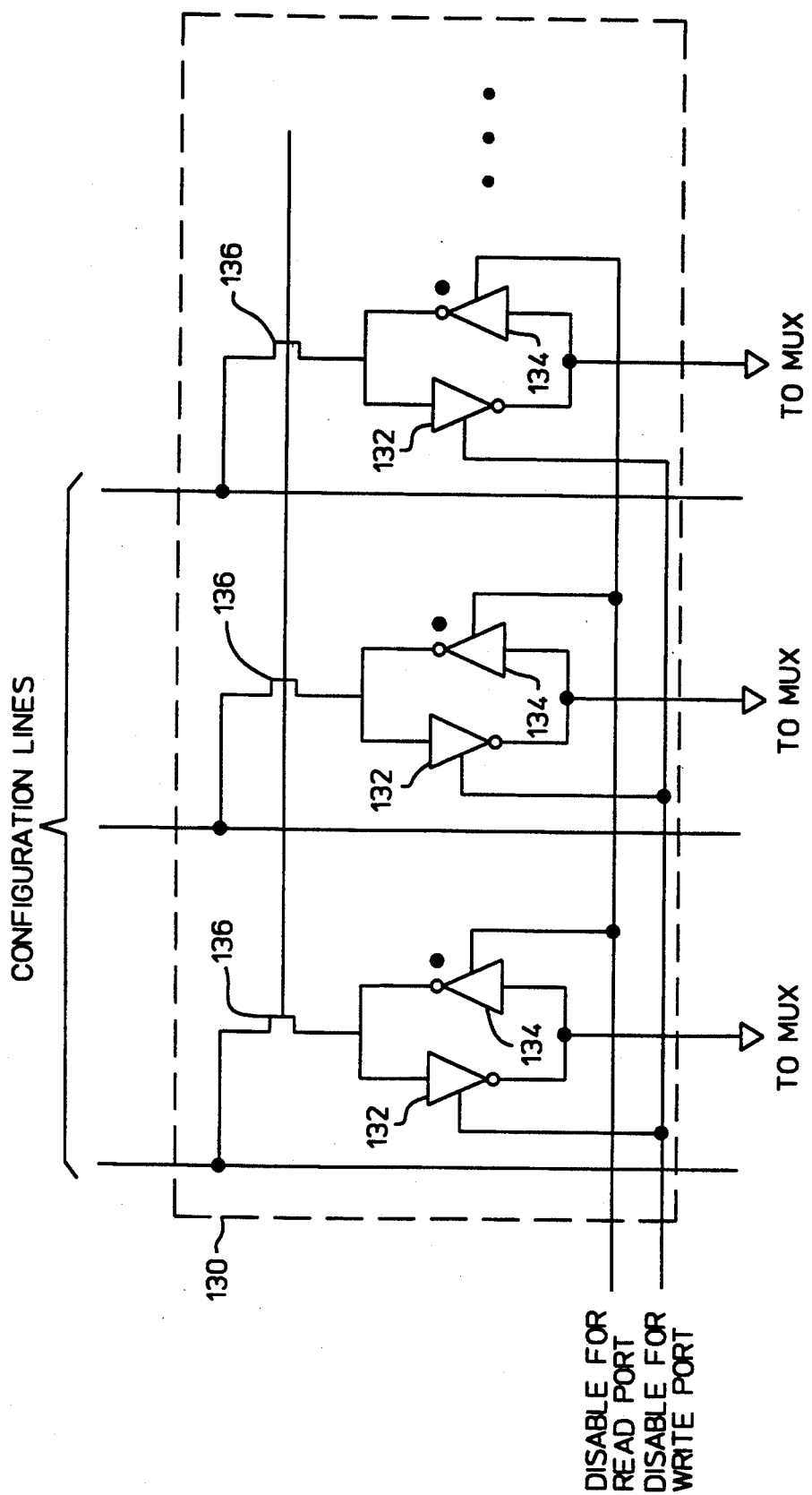
FIG. 13 is a block diagram of an implementation of a PLC memory in accordance with the invention.

FIG. 13 is a block diagram of an implementation of the PLC memory 114, 130 in accordance with the invention. The PLC memory 114, 130 includes tri-state inverters 132, 134 and pass transistors 136. The inverters 134 are open drain devices. Note, that when operated in the first mode, the PLC memory 130 will function as does conventional PLC memory. On the other hand, when the PLC memory 130 is operated in the second mode, it does not perform a memory function because one of the inverters 132, 134 in each memory cell is disabled. The operation of the PLC memory in the second mode is discussed in more detail below.

If the PLC 110 is configured as a write port, the inverters 132 driving the multiplexer 112 are disabled, the inverters 134 driving the configuration lines are put into an "open drain" mode (capable of sinking current in the low state, but not capable of driving current in the high state), and the pass transistors 136 are configured to be closed. This allows the multiplexers 112 to be run "backwards" as demultiplexers for the WRITE_ENABLE and WRITE_DATA signals, thus providing the needed dual demultiplexer functions shown in FIG. 2.

Because there is a pull-up resistor 117 connected to each configuration line, and because the inverters 134 from each PLC 110 (write ports) that drive the line are open drain, each configuration line performs a "wired-AND" function which, because of the inverters 134, effectively performs a NOR function. However, since the multiple write ports as shown in FIG. 3 require an OR operation, the wire-ANDed result should be inverted prior to its storage to the register file 119. As an example, inverters could be provided within the register file 119 to make the inversion. In any event, the left half-column of configuration lines 116-1 provide the ORed or NORed data bits for each of the 64 bits to the register file 119, and the right half-column of the configuration lines 116-2 (together with extension lines 116-3)

provides the ORed or NORed enable bits. Thus these two half-columns of configuration lines provide a pair of signals, FILE_WRITE and FILE_DATA, to each bit of the register file 119 (FIG. 12B). The output of the register file 119 drives the corresponding left half-column configuration line 116-1.

If the PLC 110 is configured as a read port (as are the PLCs below the register file 119), the inverters 134 driving the configuration lines 116-1 are disabled completely, the inverters 132 driving the multiplexers 112 are enabled, and the pass transistors 136 are closed. In this case, the multiplexers 112 for all of the read ports have access to the same 64 data bits and each can independently select a bit to be read.

Figure 14A:
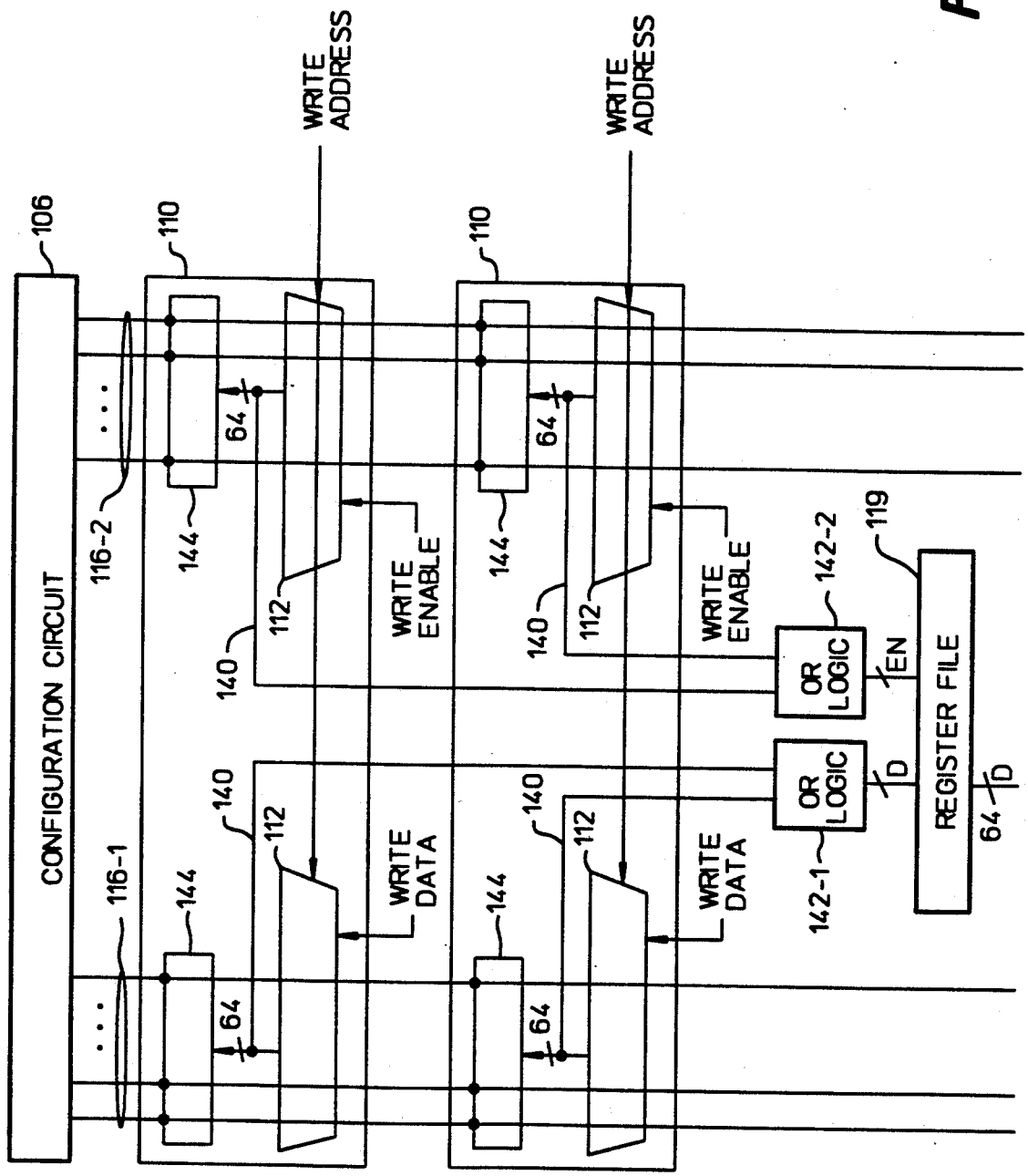

FIGS. 14A and 14B are block diagrams of a second detailed embodiment of a multi-ported register file in accordance with the invention. The portion of a PLCA shown in FIGS. 14A and 14B is illustrated in the register file mode. This embodiment is similar to the embodiment shown in FIGS. 11A and 11B; therefore, only the differences will be discussed. In this embodiment the pull-up registers 117 and the controllable switches 118 are replaced by additional wiring buses 140 and OR logic circuits 142. In this case, OR logic circuit 142-1 will logical OR the respective bits of the additional buses 140, thereby functioning as do the OR gates 30 shown in FIG. 3. Moreover, in this embodiment the PLC memories 144 are conventional and need not be modified as they were in FIGS. 11A and 11B. Additionally, a data bus 146 is provided to supply the data read from the register file 119 to the PLCs 110 functioning as read ports. The amount of wiring needed in this embodiment can be reduced if the configuration buses 116 are used as they are in FIGS. 11A and 11B because the additional buses 140 can then be substantially shortened or eliminated.

In summary, register file bit slices are supported by grouping PLCs together into "columns", by adding a file register, pull-up resistors or OR circuits, and by slightly modifying the memory cells within each PLC. Write ports work by running the PLC multiplexers backwards as demultiplexers. Multiple write ports are supported by wire-ANDing or ORing DATA and ENABLE signals produced by each write port. Bits written from the write ports are stored in a register file, which drives the configuration lines attached to the read ports. Read ports work by reading the configuration lines (rather than the PLC memory bits) through the PLC multiplexers.

Although the embodiments illustrated in FIGS. 10-13 concern a multi-ported register file, the invention applies to a demultiplexer itself. For example, the PLCA 100 shown in FIG. 10 includes PLCs 102 which operate as write ports when the PLCA is in the register file mode. In so doing, the PLC multiplexers 112 actually function backwards so as to operate as demultiplexers. Thus, the invention more generally relates to a PLC which can be operated backwards so as to function as a demultiplexer.

The many features and advantages of the invention are apparent from the written description and thus it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A programmable logic cell array, comprising:
   programmable logic cells, each of the programmable logic cells having more inputs than outputs, and each of said programmable logic cells being capable of performing a logic function; and
   configurable routing resources to connect inputs and outputs of said programmable logic cells,
   at least one of said programmable logic cells being configured to implement at least a memory and a multiplexer, wherein, in a normal mode, said memory stores data and said multiplexer selects and outputs the data and, in a backwards mode, said multiplexer operates as a demultiplexer and said memory passes data output by the demultiplexer to the inputs to said programmable logic cell which serve as outputs in the backwards mode.

2. A programmable logic cell array as recited in claim 1, wherein, in the normal mode, the data to be stored in said memory is supplied to said memory via a configuration bus, and, in the backwards mode, the data output by the demultiplexer is operatively connected to said configuration bus via said memory.

3. A programmable logic cell array as recited in claim 2, wherein said cell array further comprises controllable switches operated to connect said configuration bus with one of a configuration control circuit and a pullup unit.

4. A programmable logic cell array as recited in claim 1, wherein said memory comprises a plurality of pairs of cross-coupled inverters, with at least one of the inverters of each of said pairs being a tri-state device.

5. A programmable logic cell array as recited in claim 1, wherein the other one of the inverters of each of said pairs is an open drain device.

6. A programmable logic cell array as recited in claim 1, wherein, in the normal mode, the data to be stored in said memory is supplied to said memory via a configuration bus, and, in the backwards mode, the data output by the demultiplexer is operatively connected to an additional wiring bus.

7. A programmable logic array comprising:
   at least one register file for storing data;
   programmable logic cells having inputs and outputs, a plurality of said programmable logic cells being operatively connected to said at least one register file, and each of said programmable logic cells being operable in a forward mode, a backwards mode and a normal mode; and
   configurable routing resources to connect inputs and outputs of said programmable logic cells;
   wherein write ports for said register file are formed by said programmable logic cells operated in the backwards mode, and read ports for said register file are formed by said programmable logic cells operated in the forward mode.

8. A programmable logic array as recited in claim 7, wherein each of said programmable logic cells comprise a logic cell memory and a selector coupled to said logic cell memory, and
   wherein said selector is implemented using a tree of bi-directional pass transistors, and each memory cell in said logic cell memory includes at least a pair of tri-state cross-coupled inverters.

9. A programmable logic array as recited in claim 8, wherein, in the backwards mode, said selector of programmable logic cell functions as a decoder and a first of said tri-state inverters is disabled.

10. A programmable logic array as recited in claim 9, wherein the first of said tri-state inverters is an open drain device.

11. A programmable logic array as recited in claim 8, wherein, in the backwards mode, said selector functions as a decoder to output data to be written to said register file from the inputs of said selector, and said memory functions to pass the data to be written so as to output the data to be written to said register file from the inputs of said memory.

12. A programmable logic array as recited in claim 10, wherein, in the forward mode, said memory functions to pass the data from said register file to said selector, and said selector functions as a selector to output the data read from said register file.

13. A programmable logic array as recited in claim 7, wherein each of said programmable logic cells comprise a logic cell memory and a selector coupled to said logic cell memory, and wherein said programmable logic array further comprises means for ORing data output from the inputs of said selector for said programmable logic cells operated in the backwards mode.

14. A programmable logic array as recited in claim 8, wherein said programmable logic array further comprises:

a plurality of configuration lines operatively connected to said programmable logic cells and said register file;

a configuration control circuit for supplying signals to said configuration lines to program said logic cell memory of said programmable logic cells;

a plurality of pull-up resistors having first and second ends, the first end being operatively connectable to a voltage source; and a plurality of controllable switches for operatively connecting said configuration lines to said configuration control circuit or the second end of said pull-up resistors.

15. A programmable logic array as recited in claim 14, wherein for said programmable logic cells in the backwards mode said controllable switches operatively connect said configuration lines to said pull-up resistors.

* * * * *